(12) United States Patent
Sreenivasan et al.

(10) Patent No.: US 9,415,418 B2
(45) Date of Patent: Aug. 16, 2016

(54) PROGRAMMABLE DEPOSITION OF THIN FILMS OF A USER-DEFINED PROFILE WITH NANOMETER SCALE ACCURACY

(71) Applicant: Board of Regents, The University of Texas System, Austin, TX (US)

(72) Inventors: Sidlgata V. Sreenivasan, Austin, TX (US); Shrawan Singhal, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/462,198

(22) Filed: Aug. 18, 2014

(65) Prior Publication Data
US 2015/0048050 A1 Feb. 19, 2015

Related U.S. Application Data

(60) Provisional application No. 61/867,393, filed on Aug. 19, 2013.

(51) Int. Cl.
*B05D 1/40* (2006.01)
*B05D 3/06* (2006.01)
(Continued)

(52) U.S. Cl.
CPC .. *B05D 1/40* (2013.01); *B05D 1/02* (2013.01); *B05D 1/34* (2013.01); *B05D 1/42* (2013.01); *B05D 3/007* (2013.01); *B05D 3/067* (2013.01); *B05D 3/12* (2013.01); *B05D 5/00* (2013.01); *B29C 35/0888* (2013.01); *B29C 43/021* (2013.01); *B29C 59/026* (2013.01); *B81C 1/0046* (2013.01); *B82Y 40/00* (2013.01); *G03F 7/0002* (2013.01); *H01L 21/0271* (2013.01); *B05D 3/0254* (2013.01); *B05D 3/0466* (2013.01); *B05D 3/0486* (2013.01); *B05D 3/0493* (2013.01)

(58) Field of Classification Search
None
See application file for complete search history.

(56) References Cited

U.S. PATENT DOCUMENTS 6,048,799 A 4/2000 Prybyla
8,394,282 B2 3/2013 Panga et al.
(Continued)

OTHER PUBLICATIONS

D. Lentz, et al., "Whole Wafer Imprint Patterning Using Step and Flash Imprint Lithography: A Manufacturing Solution for Sub 100nm Patterning", Proc. of SPIE, vol. 6615, year 2007, pp. 65172F-1 to 65172F-10.*

(Continued)

*Primary Examiner* — Jiong-Ping Lu
(74) *Attorney, Agent, or Firm* — Robert A. Voigt, Jr.; Winstead, P.C.

(57) ABSTRACT

An inkjet-based process for programmable deposition of thin films of a user-defined profile. Drops of a pre-cursor liquid organic material are dispensed at various locations on a substrate by a multi-jet. A superstrate that has been bowed due to a backside pressure is brought down such that a first contact of the drops is made by a front side of the superstrate thereby initiating a liquid front that spreads outward merging with the drops to form a contiguous film captured between the substrate and the superstrate. A non-equilibrium transient state of the superstrate, the contiguous film and the substrate then occurs after a duration of time. The contiguous film is then cured to crosslink it into a polymer. The superstrate is then separated from the polymer thereby leaving a polymer film on the substrate. In such a manner, non-uniform films can be formed without significant material wastage in an inexpensive manner.

36 Claims, 13 Drawing Sheets

(51) Int. Cl.

| | | |
|---|---|---|
| B05D 1/34 | (2006.01) | |
| B05D 3/00 | (2006.01) | |
| B05D 5/00 | (2006.01) | |
| B05D 1/02 | (2006.01) | |
| B05D 3/12 | (2006.01) | |
| B05D 1/42 | (2006.01) | |
| H01L 21/027 | (2006.01) | |
| B82Y 40/00 | (2011.01) | |
| G03F 7/00 | (2006.01) | |
| B81C 1/00 | (2006.01) | |
| B29C 35/08 | (2006.01) | |
| B29C 59/02 | (2006.01) | |
| B29C 43/02 | (2006.01) | |
| B05D 3/04 | (2006.01) | |
| B05D 3/02 | (2006.01) | |

(56) References Cited

U.S. PATENT DOCUMENTS

| | | | |
|---|---|---|---|
| 2005/0270312 A1* | 12/2005 | Lad | B41J 3/28 347/1 |
| 2006/0076717 A1 | 4/2006 | Sreenivasan et al. | |
| 2007/0102844 A1* | 5/2007 | Simon | B29C 59/022 264/259 |
| 2009/0243153 A1 | 10/2009 | Sreenivasan et al. | |
| 2010/0012622 A1* | 1/2010 | Panga | B82Y 10/00 216/52 |

OTHER PUBLICATIONS

A. Francone, "Materials and Anti-Adhesive Issues in UV-NIL", Ph.D. Thesis, Institut National Polytechnique de Grenoble—INPG, 2010.*

K. Ozawa, et al., Development of a Femtoliter Piezo Ink-jet Head for High Resution Printing, NIP 23 and Digital Fabrication 2007, pp. 898-901.*

Ozawa et al., "Development of a Femtoliter Piezo Ink-Jet Head for High Resolution Printing," Society for Imaging Science and Technology, NIP23 and Digital Fabrication 2007, Final Program and Proceedings, pp. 898-901.

Park et al., "High-Resolution Electrohydrodynamic Jet Printing," Nature Materials, vol. 6, Oct. 2007, pp. 782-789.

Gubarev et al., "An Investigation of Differential Deposition for Figure Corrections in Full-Shell Grazing-Incidence X-ray Optics," Nuclear Instruments and Methods in Physics Research A, vol. 616, 2010, pp. 273-276.

Stafford et al., "Generaeting Thickness Gradients of Thin Polymer Films via Flow Coating," Review of Scientific Instruments, vol. 77, No. 023908, 2006, pp. 1-7.

Boning et al., "Nanotopography Issues in Shallow Trench Isolation CMP," Mrs Bulletin, Oct. 2002, pp. 761-765.

Sakdinawat et al., "Nanoscale X-ray Imaging," Nature Photonics, vol. 4, Dec. 2010, pp. 840-848.

Muller et al., "Techniques for Analysing Nanotopography on Polished Silicon Wafers," Microelectronic Engineering, vol. 56, 2001, pp. 123-127.

Colburn et al., "Ramifications of Lubrication Theory on Imprint Lithography," Microelectronic Engineering, vol. 75, 2004, pp. 321-329.

Colburn et al., "Step and Flash Imprint Lithography: A New Approach to High-Resolution Patterning," SPIE: Emerging Lithographic Technologies III, vol. 3676, 1999, pp. 379-389.

Bailey et al., "Step and Flash Imprint Lithography: Template Surface Treatment and Defect Analysis," J. Vac. Sci. Technol. B, vol. 18, No. 6, Nov./Dec. 2000, pp. 3572-3577.

Lentz et al., "Whole Wafer Imprint Patterning Using Step and Flash Imprint Lithography: A Manufacturing Solution for Sub 100 nm Patterning," Proc. of SPIE, vol. 6517, 65172F, 2007, pp. 1-10.

Zhang et al., "High Resolution and High Throughput X-ray Optics for Future Astronomical Missions," Proc. of SPIE, vol. 8861, 88610N, pp. 1-13.

International Search Report and Written Opinion for International Application No. PCT/US2014/051526 dated Nov. 27, 2014, pp. 1-10.

International Preliminary Report on Patentability for International Application No. PCT/US2014/051526 dated Feb. 23, 2016, pp. 1-7.

* cited by examiner

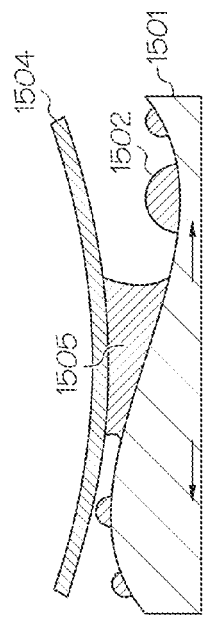
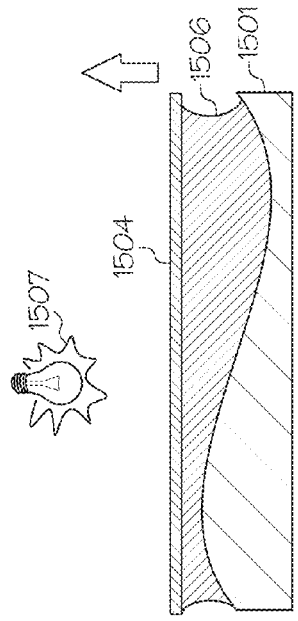
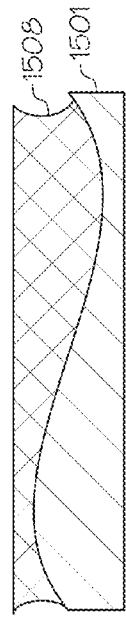
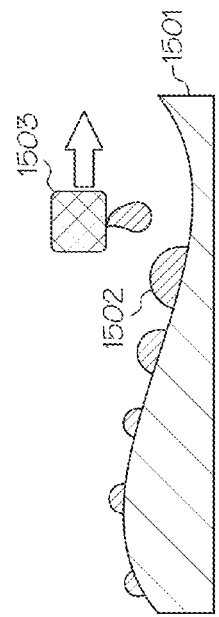
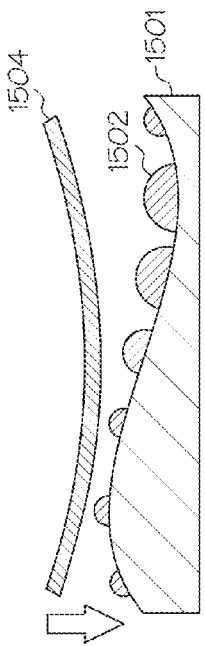

PROGRAMMABLE DEPOSITION OF THIN FILMS OF A USER-DEFINED PROFILE WITH NANOMETER SCALE ACCURACY

CROSS REFERENCE TO RELATED APPLICATIONS

This application is related to the following commonly owned U.S. Patent Application:

Provisional Application Ser. No. 61/867,393, "Programmable Deposition of Nanoscale Films," filed Aug. 19, 2013, and claims the benefit of its earlier filing date under 35 U.S.C. §119(e).

GOVERNMENT INTERESTS

The U.S. Government has certain rights in this invention pursuant to the terms of the National Science Foundation Grant No. ECCS-1120823.

TECHNICAL FIELD

The present invention relates generally to thin film deposition, and more particularly to programmable deposition of thin films of a user-defined profile with nanometer scale accuracy.

BACKGROUND

Fabrication of most micro- and nano-fabricated devices including semiconductors, photonic and optoelectronic devices, MEMS/NEMS, electronic displays (such as LCDs), etc. requires the deposition of many thin films. Several deposition options exist in the industry today. Deposition in the liquid phase is typically carried out by processes, such as spin-coating, which is often used as a precursor to subsequent reactions that solidify the liquid to obtain the desired thin film. In the vapor phase, the most commonly used technique is that of Chemical Vapor Deposition (CVD). In a typical CVD process, the substrate is exposed to precursors in the gaseous phase that react or decompose to form the desired film on the surface of the substrate. There are several types of CVD processes. Depending upon the pressure used, they can be classified as Atmospheric Pressure CVD (APCVD), Low Pressure CVD (LPCVD) or Ultrahigh Vacuum CVD (UHVCVD). Low pressures tend to reduce unwanted reactions and improve film thickness uniformity. Plasma based methods, such as Plasma Enhanced CVD (PECVD), are used to enhance the chemical reactions. Remote PECVD is also used in the deposition of thin films in the semiconductor industry to lower deposition temperatures and protect the substrate from high-temperature effects. A technique called Atomic Layer Deposition (ALD) is also frequently used to produce conformal monolayers of one or more different materials. Physical Vapor Deposition (PVD) methods are also important thin film deposition techniques. As the name suggests, they do not rely on chemical reactions, but deposit condensed forms of a vaporized material onto the substrate in a vacuum environment. Evaporative deposition and sputtering are two common examples of PVD. The former heats the material to be deposited to a high vapor pressure, while the latter utilizes a plasma discharge to bombard the substrate surface with atoms of the material to be deposited.

All the processes discussed above deposit thin films in a manner where the amount of material deposited per unit area is substantially the same. The ability to tailor materials to form intentionally non-uniform films is not typically possible for these processes. Also, processes, such as spin-coating, involve significant material wastage while vacuum processes can be expensive due to the need to pump down chambers where processing is performed.

Hence, there is not currently a means for forming intentionally non-uniform films without significant material wastage in an inexpensive manner.

BRIEF SUMMARY

In one embodiment of the present invention, a process for depositing thin films comprises dispensing drops of a pre-cursor liquid organic material at a plurality of locations on a substrate by an array of inkjet nozzles. The process further comprises bringing down a superstrate thereby allowing the drops to form a contiguous film captured between the substrate and the superstrate. The process additionally comprises enabling a non-equilibrium transient state of the superstrate, the contiguous film and the substrate to occur after a duration of time. Furthermore, the process comprises curing the contiguous film to solidify it into a solid. Additionally, the process comprises separating the superstrate from the solid thereby leaving a polymer film on the substrate.

In another embodiment of the present invention, a process for depositing intentionally non-uniform films comprises obtaining a desired non-uniform film thickness profile. The process further comprises solving an inverse optimization program to obtain a volume and a location of dispensed drops so as to minimize a norm of error between the desired non-uniform film thickness profile and a final film thickness profile such that a volume distribution of the final film thickness profile is a function of the volume and the location of the dispensed drops. The process additionally comprises dispensing the drops of a pre-cursor liquid organic material at a plurality of locations on a substrate by an array of inkjet nozzles. Furthermore, the process comprises bringing down a superstrate to form a contiguous film captured between the substrate and the superstrate. Additionally, the process comprises enabling a non-equilibrium transient state of the superstrate, the contiguous film and the substrate to occur after a duration of time given by the inverse optimization scheme. In addition, the process comprises curing the contiguous film to solidify it into a polymer. The process further comprises separating the superstrate from the polymer thereby leaving a polymer film on the substrate.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWINGS

A better understanding of the present invention can be obtained when the following detailed description is considered in conjunction with the following drawings, in which:

FIGS. 15A-15F depict the cross-sectional views for polishing of wafer topography using the steps described in FIG. 14 in accordance with an embodiment of the present invention.

DETAILED DESCRIPTION

The present invention presents a versatile inkjet-based process for programmable deposition of thin films of a user-defined profile with nanometer scale accuracy. This method is hereby referred to as Programmable Inkjetting of Thin-films or PAINT. PAINT offers unique and enabling capabilities due to its abilities to obtain programmable film thickness profiles; and since it can perform such a process at high process speeds and with near-zero material wastage. This combination of enabling performance and low cost has the potential to have significant applications as discussed herein. PAINT can also deposit films of uniform thickness at near-zero material wastage thereby being useful for depositing uniform films in cost sensitive applications. PAINT is substantially agnostic towards the choice of substrate type, thickness or material and is capable of depositing films over large areas. By design, PAINT can also substantially decouple the influence of systematic parasitics, such as surface topography, inkjet drop volume variation, etc., and prevent them from corrupting the final film thickness. The most compelling use of PAINT is to generate a freeform surface, the profile of which is defined by the user and which can be modified adaptively in software, without any changes in tooling or hardware.

PAINT uses one or more arrays of inkjet nozzles, also known as a multi-jet, to dispense droplets of a pre-cursor liquid organic material on the substrate. The material can be a composition including one or more monomers, oligomers, short-chain polymers, solvents, acids, bases, salts etc. The substrate surface may be pre-treated to enhance the spreading of this material. Because of the presence of multiple nozzles in the multi-jet, the desired substrate area can be covered with the required drops in a few seconds with a scanning stage driving the multi-jet or the substrate, while retaining control over the volume and location of each dispensed drop. For each desired film thickness profile, the optimum drop volumes and locations are obtained from an inverse optimization routine wrapped around a linearized thin film lubrication model. Following drop dispense, an optimally flexible superstrate is brought down such that the first contact on the drops is made by the front side. The flexible superstrate may be bowed with the help of backside pressure or gravity. This initiates a liquid front that quickly spreads outward merging with the drops and thereby creating a contiguous film. This substrate-fluid-superstrate "sandwich" is then allowed to evolve for a desired duration given by the inverse optimization routine following which the organic material is cured by photonic or thermal energy to crosslink it into a polymer. The superstrate is then separated from the sandwich leaving the thin polymer film on the substrate. Such a process is illustrated in connection with FIGS. 1 and 2.

Figure 1:
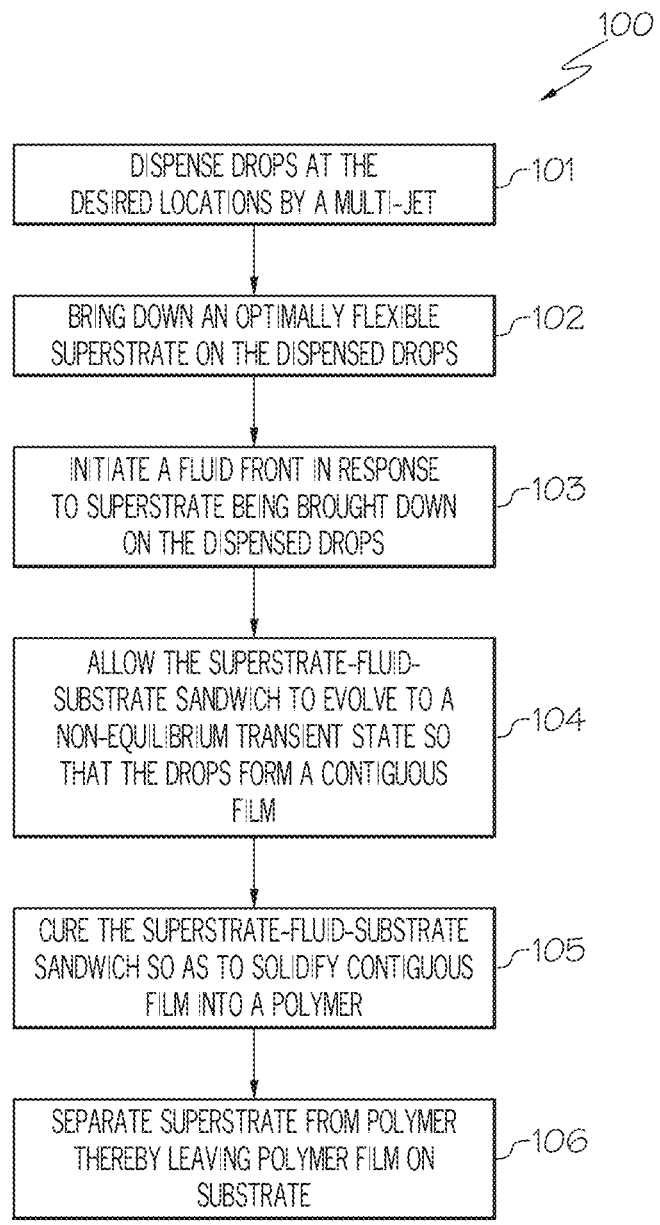
FIG. 1 is a flowchart of a method for prescribed film thickness variation using PAINT in accordance with an embodiment of the present invention.

FIG. 1 is a flowchart of a method 100 for prescribed film thickness variation using PAINT in accordance with an embodiment of the present invention. FIG. 1 will be discussed in conjunction with FIGS. 2A-2F, which depict the cross-sectional views of depositing a thin film on a substrate during the fabrication steps described in FIG. 1 in accordance with an embodiment of the present invention.

As discussed herein, the "superstrate" needs to possess "optimal flexibility" wherein its stiffness is: (1) high enough to allow urging of the liquid organic material drops to merge laterally rather than trapping individual drops as islands with the superstrate wrapped around them; and (2) low enough that the strain energy stored in the superstrate due to its deformation does not significantly impact the thin film fluid dynamic behavior prior to curing or crosslinking of the monomer. It should also be low enough to substantially mitigate the presence of a substrate topography signature and be agnostic towards it.

Figure 2A:
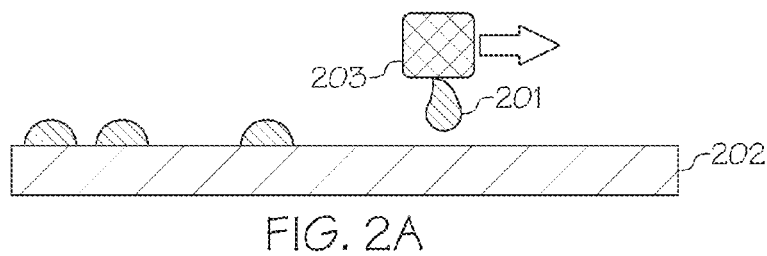
FIGS. 2A-2F depict the cross-sectional views of depositing a thin film on a substrate during the fabrication steps described in FIG. 1 in accordance with an embodiment of the present invention.

Referring to FIG. 1, in conjunction with FIGS. 2A-2F, in step 101, drops 201 of a material are dispensed at the desired locations on a substrate 202 by a multi jet 203 as illustrated in FIG. 2A. Multi-jet 203 is represented by a single jet as a multi-jet array extends into the plane of FIG. 2A. The desired locations of the drops are derived from an inverse optimization framework. In one embodiment, the minimum volume of drops 201 dispensed is below 5 picoliters using either piezo jets or electro hydro dynamic jets. In another embodiment, the minimum volume of drops 201 dispensed is below 1 picoliter using either piezo jets or electro hydro dynamic jets. In one embodiment, substrate 202 is composed of a material with a Young's modulus greater than 1 GPa. In one embodiment, substrate 202 is a rigid wafer composed of one or more of the following materials: silicon, silicon dioxide and gallium nitride.

Figure 2B:
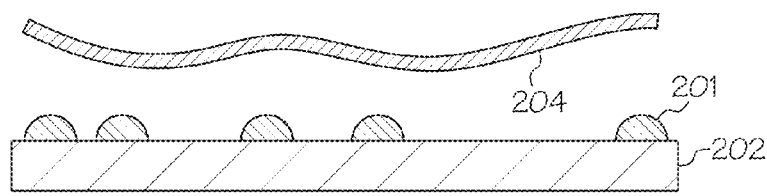

In step 102, an optimally flexible superstrate 204 is brought down on the dispensed drops 201 as illustrated in FIG. 2B.

Figure 2C:
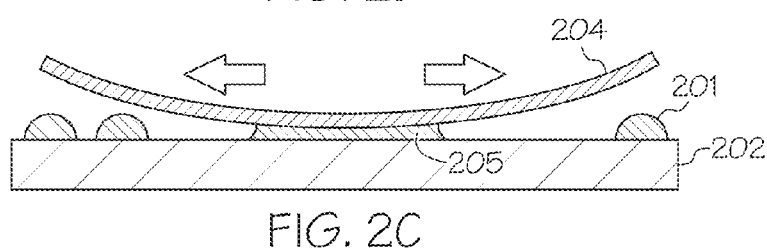

In step 103, a fluid front 205 is then initiated in response to superstrate 204 being brought down on the dispensed drops 201 as illustrated in FIG. 2C. The shape of superstrate 204 and the speed at which it comes down may be chosen to allow drops 201 to merge laterally to minimize any trapping of air bubbles to form a contiguous film. A local atmosphere of gases, such as $CO_2$, that are soluble in organic liquids or He that readily diffuses into most substrates 202 and/or superstrate 204 may be used in the substrate-superstrate sandwich region to further assist in avoiding trapping of bubbles in this process. The material of superstrate 204 can include a number of choices including but not limited to glass (e.g., quartz, fused silica, etc.), plastics (e.g., PMMA, polycarbonate, PET, PEN, etc.) or ceramics (e.g., Zerodur®), including ceramics with a thin film of a polymer. Plastic and ceramic materials have inherent porosity which further aids in the transmission of gases and avoids the trapping of bubbles. Superstrate 204 is typically polished to be locally smooth, i.e., possess low surface roughness (roughness is defined as amplitude variations across micron-scale spatial wavelengths). The surface of superstrate 204 may be coated with a low surface energy coating, such as FOTS or Teflon, while the surface of substrate 202 may be coated with an adhesion promoter, such as BARC, ValMat, or TranSpin. The use of superstrate and/or substrate coating will enhance the ability to leave the cured material onto substrate 202 at the end of this process. The inkjetted material can include UV-curable materials, such as MonoMat® and SilMat® materials offered by Molecular Imprints, Inc. or the mr-UVcur** offered by Micro-resist technologies.

Figure 2D:
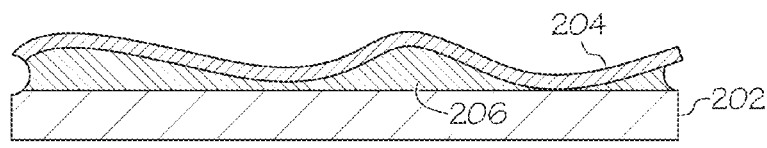

In step 104, the superstrate-fluid-substrate sandwich is allowed to evolve to a non-equilibrium transient state after a duration of time so that drops 201 form a contiguous film 206 with a superstrate layer 204 on top of the contiguous film 206 as illustrated in FIG. 2D.

Figure 2E:
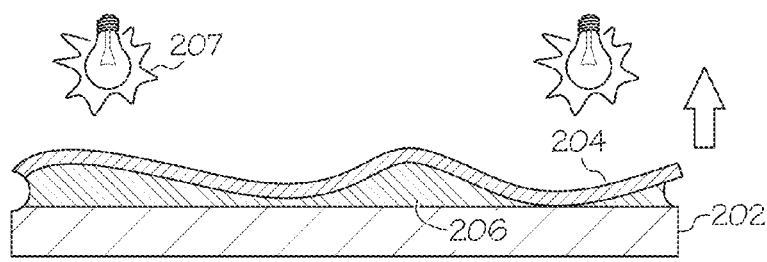

In step 105, the superstrate-fluid-substrate sandwich is cured from UV exposure 207 so as to crosslink contiguous film 206 into a polymer as illustrated in FIG. 2E.

Figure 2F:

In step 106, superstrate 204 is separated from the polymer thereby leaving a polymer film 208 on substrate 202 as illustrated in FIG. 2F. Substrate 202 is assumed to have the functional part being fabricated, while superstrate 204 is essentially a vehicle for achieving the PAINT process. In one embodiment, polymer film 208 may be etched film to allow a transfer of a film thickness profile to an underlying functional film or substrate 202 as discussed further below.

In some implementations, method 100 may include other and/or additional steps that, for clarity, are not depicted. Furthermore, in some implementations, method 100 may be executed in a different order than presented. Additionally, in some implementations, certain steps in method 100 may be executed in a substantially simultaneous manner or may be omitted.

Figure 3:
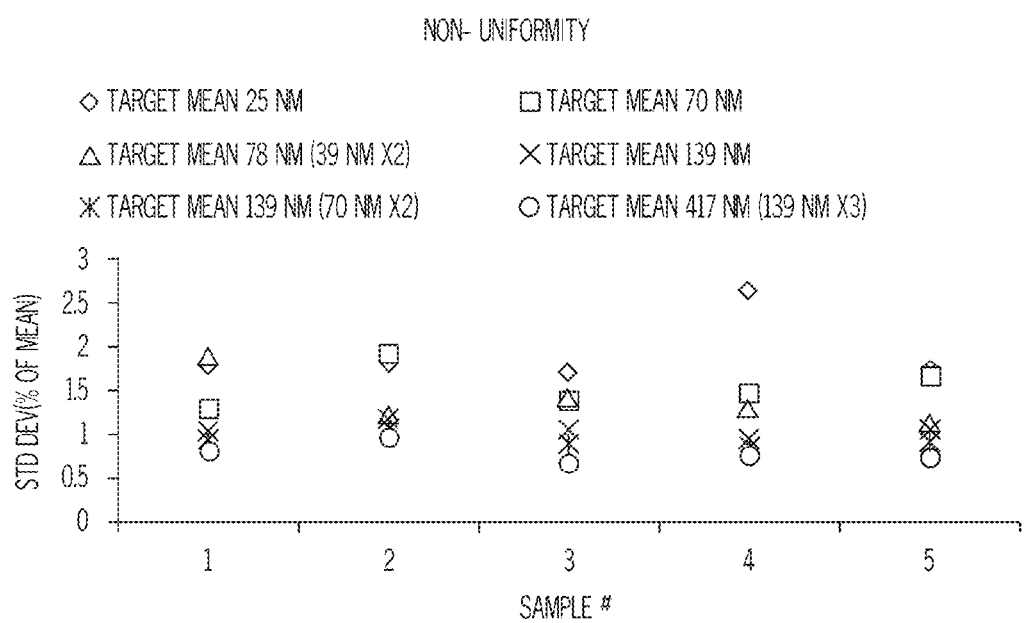
FIG. 3 is a graph depicting the experimental results for deposition of uniform films using PAINT, where films with less than 2% non-uniformity have been obtained across a wide range of thicknesses in accordance with an embodiment of the present invention.
Figure 4A:
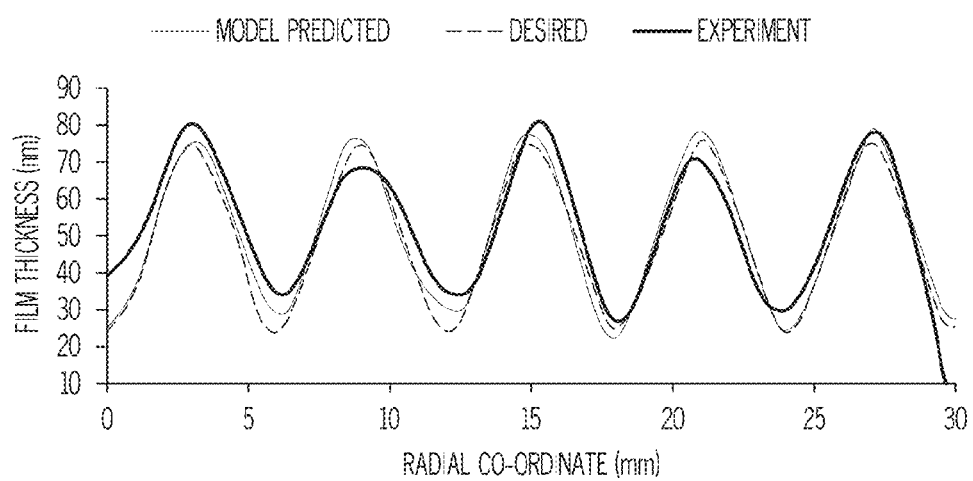
FIG. 4A is a graph illustrating the comparison of experimentally obtained data with the model prediction and desired profile for a representative sinusoidal profile in accordance with an embodiment of the present invention.
Figure 4B:
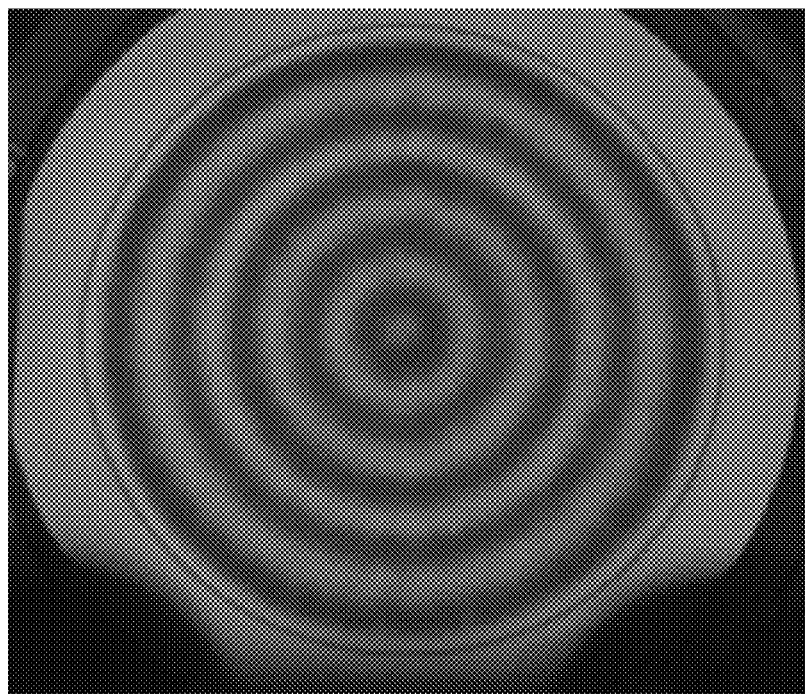
FIG. 4B is a picture of the wafer showing the sinusoidal thickness variation as shade variations in accordance with an embodiment of the present invention.

The PAINT process has been demonstrated by depositing highly uniform films (FIG. 3) and different films of non-monotonic sinusoid-type profiles (FIGS. 4A-4B) with excellent correlation with models. FIG. 3 is a graph depicting the experimental results for deposition of uniform films using PAINT, where films with less than 2% non-uniformity have been obtained across a wide range of thicknesses in accordance with an embodiment of the present invention. FIG. 4A is a graph illustrating the comparison of experimentally obtained data with the model prediction and desired profile for a representative sinusoidal profile in accordance with an embodiment of the present invention. FIG. 4B is a picture of the wafer showing the sinusoidal thickness variation as shade variations in accordance with an embodiment of the present invention. Several such profiles have been obtained through PAINT with different wavelengths.

In addition, linearly graded films as well as convex/concave profiles with nominal radius of ~10 km radius of curvature have also been obtained—all with excellent correlation with models. The linearly graded and high radius of curvature films are discussed later herein. Moreover, freeform surfaces can also be used for correcting for arbitrary surface topography, which is highly valuable for substrate polishing as discussed later herein. Hence, potential application areas span across semiconductor devices, photonics, biomedical as well as nanofluidics applications.

Fluid flow in domains that have much larger lateral length scales compared to height (thin films) can be solved using the lubrication approximation which assumes that the flow is predominantly parallel to the surface and the perpendicular pressure gradient is zero. Neglecting gravity and using this approximation, fluid volume and momentum conservation along with thin plate bending lead to the following governing equation for a thin fluid film sandwiched between two plates:

$$12\mu \frac{\partial h}{\partial t} = D\vec{\nabla} \cdot (h^3 \vec{\nabla} \nabla^4 (h + w_s - w_c)), \quad (1)$$

where $\mu$, $h(x,y,t)$, $D$, $\vec{\nabla}$, $w_s(x,y)$ and $w_c(x,y)$ are fluid viscosity, film thickness, bending rigidity of superstrate, spatial gradient vector, time-invariant nominal topography of substrate and superstrate, respectively.

The bending rigidity can be expressed as $$D = \frac{Eb^3}{12(1-v^2)},$$

where E, b and v are Young's modulus, thickness and Poisson's ratio of the superstrate, respectively. As discussed further below, in one embodiment, superstrate 204 has a bending rigidity with an optimal range defined by being higher than a minimum required to create merging of drops 201 while lower than a maximum required to ensure that contiguous film 206 does not equilibrate prior to a designed duration of time following the bringing down of superstrate 204.

Figure 5:
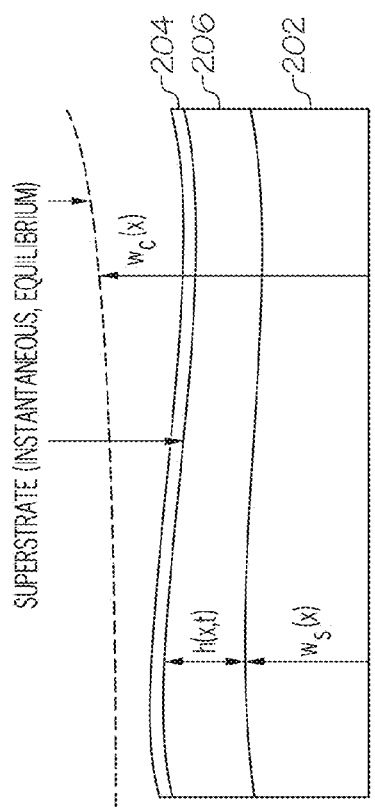
FIG. 5 illustrates the geometry of the system in accordance with an embodiment of the present invention.
Figure 6:
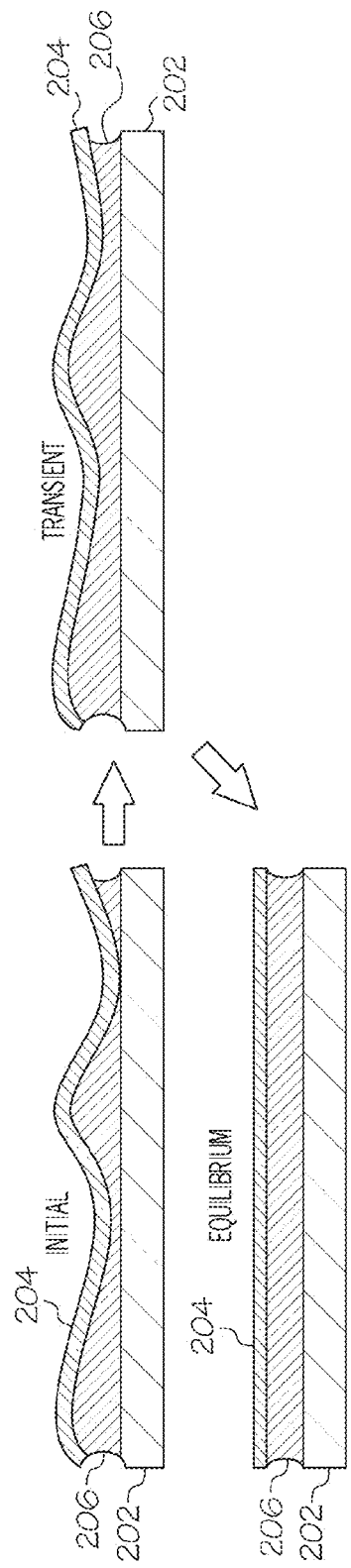
FIG. 6 illustrates the redistribution of the contiguous fluid until it reaches an equilibrium state in accordance with an embodiment of the present invention.

The geometry of the system is illustrated in FIG. 5 in accordance with an embodiment of the present invention. It has been found that a characteristic evolution time scale of the thin film sandwich, $\tau_{paint}$, is directly proportional to the area of deposition and viscosity, and inversely proportional to the bending rigidity and mean film thickness. Hence, upon increasing the thickness of the superstrate (b), mean film thickness ($h_0$) or Young's modulus (E) of the superstrate, $\tau_{paint}$, decreases, leading to more rapid redistribution of the fluid. Because of this redistribution, the final film thickness profile evolves to its equilibrium state which also contains signatures of the under- and overlying topographies from substrate 202 and superstrate 204, respectively. This rapid redistribution is generally undesirable as next discussed. This is shown in FIG. 6 for a nominally flat substrate, where FIG. 6 illustrates the redistribution of fluid 206 (see FIGS. 2D, 2E and 5) until it reaches an equilibrium state in accordance with an embodiment of the present invention. However, the aim is to minimize this redistribution such that the final film thickness can be obtained from the initial material distribution so that the "programmable" nature of PAINT can be achieved by the pre-defined locations and volumes of the inkjetted fluid drops. In other words, this dynamic model reveals the fact that it is imperative to capture a pre-equilibrium transient state in the evolution of the sandwich because the equilibrium state allows for only one possible solution that is typically undesirable and is corrupted by the topography of substrate (not shown in FIG. 6). This defeats the purpose of the programmable deposition of thin films. It is this concept of "capturing pre-equilibrium transients that substantially correlates to the inkjetted fluid drops" and rejecting the effects of substrate and superstrate topography which forms one of the inventive concepts of the PAINT process, setting it apart from prior processes. That is, a pre-equilibrium transient of contiguous film 206 creates a film thickness profile whose volume distribution is a function of a volume distribution of drops 201 dispensed on substrate 202.

Referring to FIG. 6, FIG. 6 illustrates the evolution of an initial material distribution through a transient state into its final equilibrium state. The equilibrium state has only one solution, that of a uniform film 206 in this case, and that too, because the topographies of superstrate 204 and substrate 202 have been neglected here. In general, the equilibrium is uncorrelated to the originally inkjetted fluid drop volumes/location. Therefore, PAINT needs "capturing of non-equilibrium transients that substantially correlates to the inkjetted fluid drops."

Increasing the characteristic time scale is necessary for delaying equilibrium and reducing the influence of parasitics like surface topography. At the same time, a minimum time is required to complete the merging of the fluid drops, to minimize any parasitic bubbles caused during the drop merging process, and for the fluid film to have no undesirable film thickness variations at the interstitial regions between the drops due to lack of time for completion of the merging. This minimum time that leads to a "robust" drop merging process will be referred to herein as ($\tau_{robust}$).

The characteristic time scale can be increased in the following possible ways: (i) increasing the fluid viscosity, (ii) reducing the mean film thickness, (iii) increasing the characteristic lateral length scale of the deposited area, (iv) reducing the Young's modulus of the superstrate material, and (v) reducing the thickness of the superstrate. Option (i) may not always be feasible given that the fluid properties have to be optimized for spreading, merging and curing in conjunction with film evolution and these constraints can override the requirement of viscosity. The mean film thickness and characteristic length scale in options (ii) and (iii) above may generally be governed by the deposition requirement and hence, may not be chosen to be controlled as a process parameter. The superstrate material in option (iv) may also be optimized for curing, drop spreading and separation. Hence, the preferred parameter that can be modified is the geometry of the superstrate by way of its thickness or option (v).

From the standpoint of delaying equilibrium, it is desirable to make superstrate 204 as thin as possible. However, making superstrate 204 arbitrarily thin is not feasible as discussed above in the context of optimal flexibility. In addition, thin superstrates 204 may be difficult to handle for automation, loading, etc. The optimum superstrate design can be based on the following factors, (i) type of curing (photonic/thermal/other), (ii) desired process time scale, (iii) availability of existing superstrates, (iv) need for fluid confinement, and (v) scale of typical topography encountered.

Figure 7:
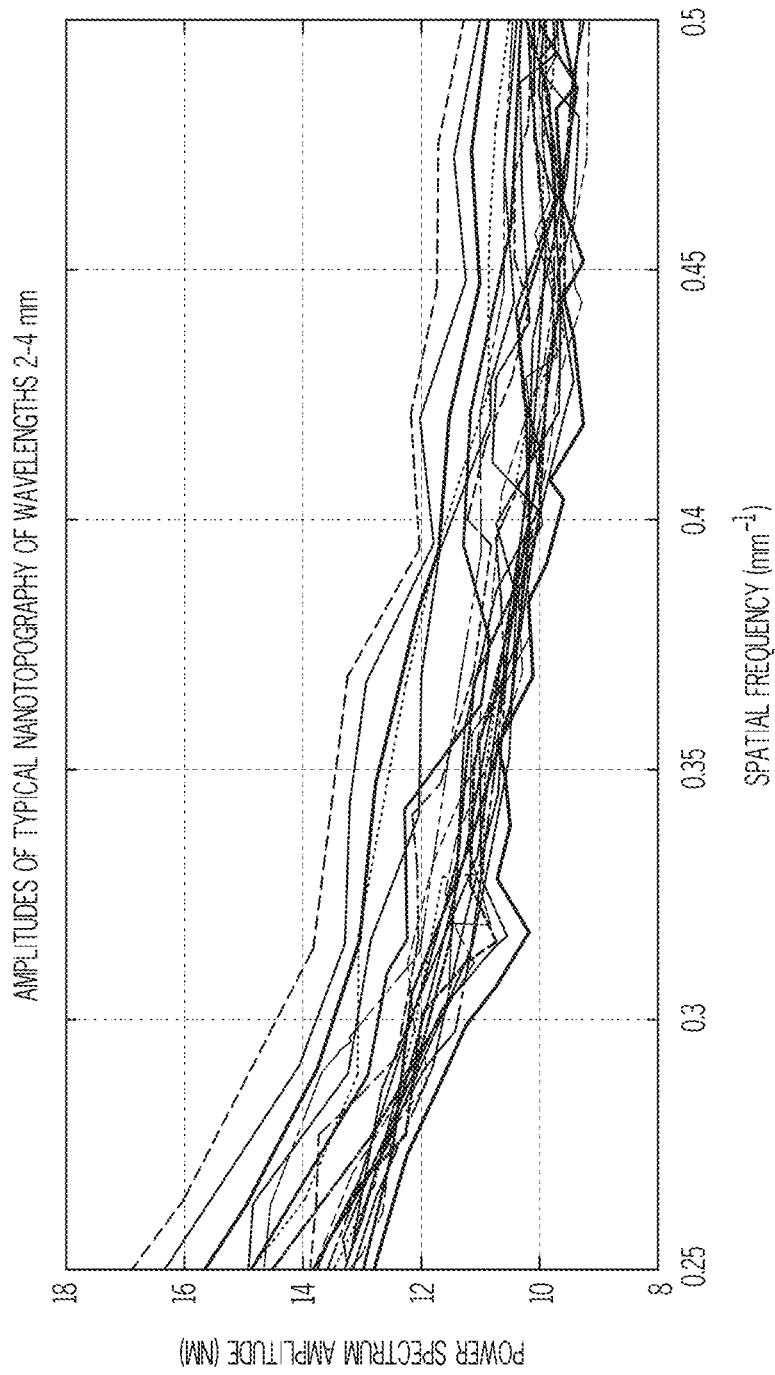
FIG. 7 is a graph depicting the amplitude distribution for different spatial frequencies as measured across different line scans on a polished 3" silicon wafer in accordance with an embodiment of the present invention.

As an example, for typical polished Si wafers, the scale of topography is illustrated in FIG. 7. FIG. 7 is a graph depicting the amplitude distribution for different spatial frequencies as measured across different line scans on a polished 3" silicon wafer in accordance with an embodiment of the present invention. For a UV-curing process, fused silica wafers can be used as superstrate 204. Since these wafers cannot be thinned down arbitrarily because of their fragility, they can be designed to have an outer ring of higher thickness where they can be handled and an inner circle of lower thickness where they interact with the fluid. The determination of the optimum thickness value comes from the nanotopography amplitudes and value of the desired time scale along with the corresponding process parameters in equation 2. For a time scale of ~100 s, mean film thickness of ~100 nm, Monomat® resist from Molecular Imprints, and minimizing corruption due to topography of ~10 nm at 2 mm wavelength, the optimum thickness of superstrate 204 is in the range of 0.01-1 mm. Going lower than 0.01 mm can prevent drops spaced more than 5 mm apart from each other from merging and hence, causes defects such as air bubbles and voids. If, however, it is not necessary to place neighboring drops that far apart, then it helps to reduce the thickness even further. On the other hand, going higher than 1 mm causes rapid equilibration and manifestation of parasitic topography on the deposited film.

Figure 8:
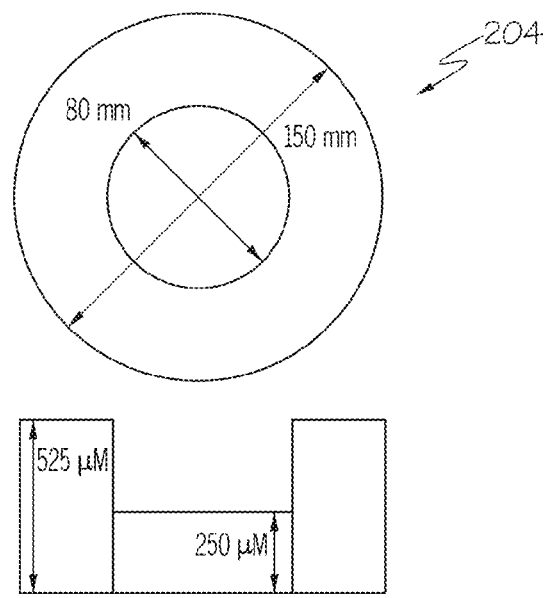
FIG. 8 illustrates a design of the superstrate showing the arrangement of different thicknesses in accordance with an embodiment of the present invention.

Referring now to FIG. 8, FIG. 8 illustrates a design of superstrate 204 showing the arrangement of different thicknesses in accordance with an embodiment of the present invention. A flexible superstrate 204 was realized on a standard wafer of 0.525 mm thickness and carving out an inner circle of 0.25 mm thickness. Further enhancements to the design can be made by using mesas on the thinner side to pin the fluid front and confine the fluid into a pre-defined region. Additional superstrate geometries include the use of plastic materials that have much lower Young's modulus compared to fused silica superstrates, and hence, can allow for higher thickness. Additionally, the porous nature of these materials lends themselves to rapid dissolution of gases and minimization of trapped bubbles. Such plastic superstrates 204 can be used as stand-alone plates, similar to their fused silica counterparts, or in a tension-controlled roll-roll configuration. In-plane superstrate forces and moments can be combined with the existing bending rigidity to form an effective bending rigidity of the superstrate. A desirable superstrate approach involves using a superstrate 204 that is quite flexible, is held in tension with an effective bending rigidity that is just high enough to ensure robust merging of drops, and the tension is reduced once the drops have merged to minimize the effective bending rigidity to enhance the ability to capture pre-equilibrium transients. The roll to roll flexible superstrate 204 has an added benefit of allowing for quick re-loading to prevent repeated defects from particulate contamination. Because the superstrate embodiment is on a roll of plastic, it is relatively inexpensive leading to a significant reduction in process cost as illustrated in FIG. 9A.

Figure 9A:
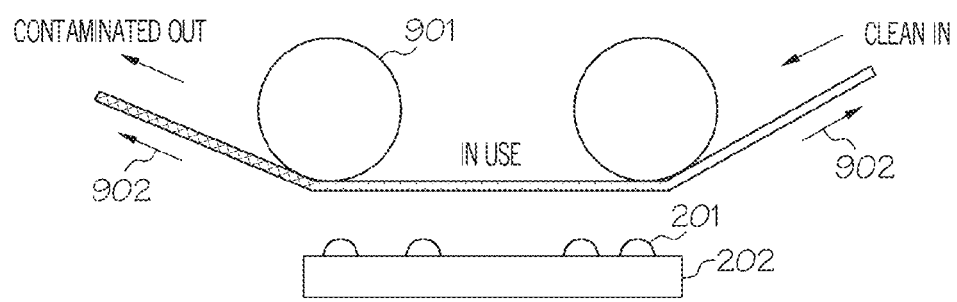
FIG. 9A illustrates a reloadable roll-roll configuration of the superstrate in accordance with an embodiment of the present invention.

FIG. 9A illustrates a reloadable roll-roll configuration of superstrate 204 in accordance with an embodiment of the present invention. In this embodiment, superstrate 204 is a roll of plastic 901 which is held under tension (see arrows 902). Only a part of the roll 901 is used as superstrate 204. Upon repeating the PAINT process, the used part can get contaminated from particulate matter as well as process defects. Once that is identified, the rolls 901 can be rotated to bring in a cleaner superstrate area. After the entire roll is thus used, it can be discarded and a fresh roll loaded for quick process turnaround.

However, the addition of in-plane tension changes the evolution dynamics of the superstrate-fluid-substrate sandwich. In order to achieve the same performance measure as the fused silica superstrates 204, the required in-plane tension is approximately 0.1-100 kN/m. In general, with a plastic superstrate thickness of 100 μm or lower, the in-plane stresses with this range of tension values can potentially exceed the material tensile stress limits, thereby leading to the possibility of critical tensile or even buckling failure. Thus, while a thin superstrate 204 is desirable to make superstrate 204 more flexible and have a high process time scale, it should not be so thin that it fails in tension.

Along with superstrate 204 being a roll of polymer web, the substrate 202, too, can be embodied as another roll of plastic in a R2R configuration. PAINT gives best results when substrate 202 is more rigid in comparison to superstrate 204. To keep substrate 202 from deforming less than superstrate 204, the ratio of the effective bending rigidity for substrate 202 to superstrate 204 should be kept less than 5. For tighter tolerances on the manifestation of parasitic topography, this ratio limit needs to be correspondingly higher. For plate-like substrates, a rigid substrate 202 is realized by holding them on a chuck against vacuum. The same can be utilized for highly flexible substrates, such as PET, PC, PEN, etc. in a R2R setup, by holding them partially or completely on a porous or vacuum chuck with a highly polished surface and allowing for slip as substrate 202 rolls forward. This can be obtained even with superstrate 204 as a roll, as long as superstrate 204 is much more flexible compared to substrate 202 as illustrated in FIG. 9B.

Figure 9B:
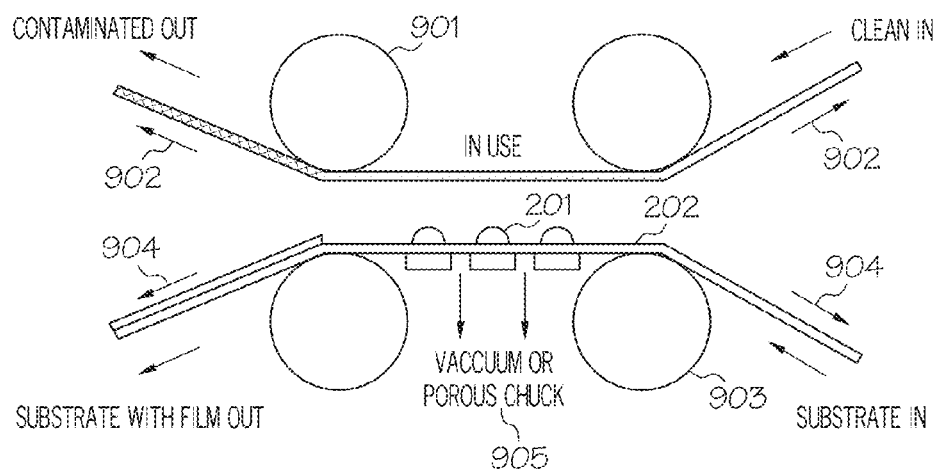
FIG. 9B illustrates a reloadable superstrate with the substrate also in the reloadable roll-roll configuration in accordance with an embodiment of the present invention.

FIG. 9B illustrates a reloadable superstrate 204 with substrate 202 also in R2R configuration in accordance with an embodiment of the present invention. As illustrated in FIG. 9B, substrate 202 is a roll of plastic 903 which is held under tension (see arrows 904). The highly flexible substrate 202 can be held against a vacuum or porous chuck 905 to increase its effective bending stiffness during the PAINT process.

Figure 10:
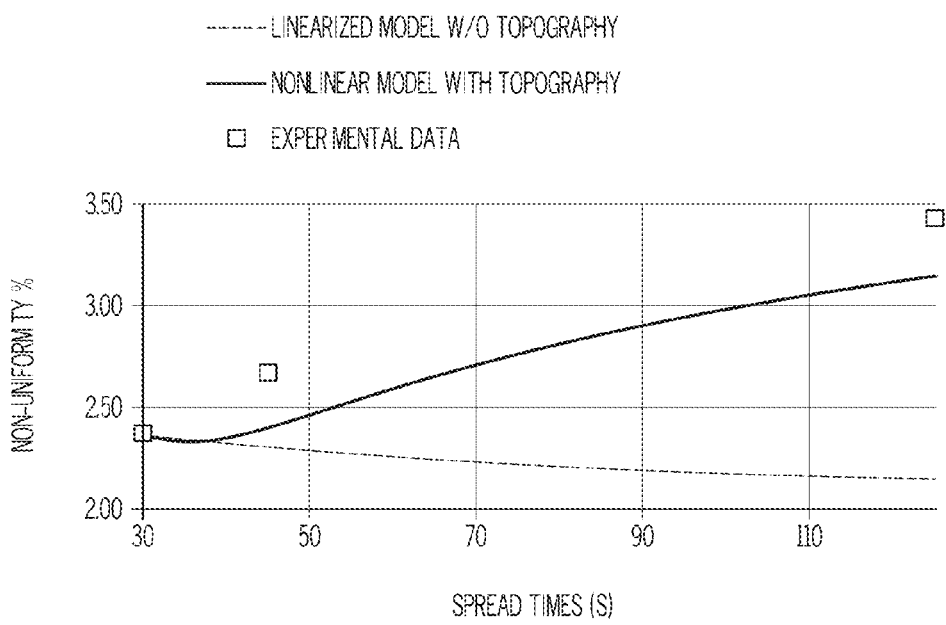
FIG. 10 is a graph depicting the comparison of time evolution of non-uniformity indicating the feasibility of the linearized model without topography for small spread times in accordance with an embodiment of the present invention.

The thin film lubrication model given in equation 1 is highly nonlinear and complicated because of the inclusion of extraneous topography inputs, thus requiring expensive numerical simulations. However, first order properties of the model can be obtained analytically by conducting a linear analysis with $\tilde{h}(\tilde{r}, \tilde{t})=1+\tilde{\epsilon}(\tilde{r}, \tilde{t})$ where $\|\epsilon\|<<1$ and no topography. This new linearized model is compared against both, experimental data, and solution of the full non-linear model with topography for uniform films. The evolution of non-uniformity is summarized in FIG. 10. FIG. 10 is a graph depicting the comparison of time evolution of non-uniformity indicating the feasibility of the linearized model without topography for small process times in accordance with an embodiment of the present invention. From the results, it can be seen that the experimental data matches well with both versions of the model for smaller process times. However, for higher process times, the linearized model without topography does not agree well with the experimental data or the nonlinear model which agrees better with the experimental data. This reveals that if the process time (t) is kept 'relatively small' ($<\tau_{linear}$), the difference between the two models can be negligible. This is highly desirable as the linearized model without topography can be solved analytically thereby drastically reducing computational complexity and allowing for a key aspect of PAINT to be solved: optimal locations and volumes of fluid drops for a desired film thickness profile.

Now, the value of $\tau_{linear}$ depends on the effective bending rigidity of superstrate 204, as a more flexible superstrate 204 will allow a greater window before corruption of the linearized model can occur due to topography. However, from earlier discussions, the minimum time scale of the process should be large enough to allow robust merging of the discrete drops 201 and create a contiguous film 206 with minimal bubbles. Therefore, it is evident that $\tau_{linear}>\tau_{robust}$ and also allow for a reasonable process window to capture the desired pre-equilibrium transient.

It is also important to note here that while $\tau_{linear}$ is dependent on the superstrate bending stiffness, $\tau_{robust}$ is not, as long as the drops 201 are spaced apart at reasonable distances, e.g., less than 5 mm apart. Optimum spreading and merging of drops 201 is also dependent on the stiffness of superstrate 204. If the drops 201 are spaced far apart from each other, superstrate 204 will need to carry more strain energy to urge drops 201 to spread and merge, thereby driving the design of superstrate 204 towards a stiffer material or thicker geometry. This problem can be alleviated by lowering the individual drop volumes and keeping drops 201 close to each other.

If the above approach is used to choose an optimal (τ) in the interval of ($\tau_{robust}$, $\tau_{linear}$), for substrates with similar topography profiles, it is sufficient to use the linearized model without topography. This approach may make the PAINT process substantially agnostic towards the topography of both substrate and superstrate. This is an important aspect of PAINT as it is very difficult to control the topography of substrates 202 and/or superstrates 204 to small amplitudes, particularly at acceptable polishing costs. Therefore, the control of film thickness profile obtained is substantially unaffected by the polishing quality of substrates 202 and/or superstrates 204. In other words, the accuracy of the film thickness profile obtained using PAINT can far exceed the undesirable topography of substrate 202 and/or superstrate 204.

The above statements regarding PAINT being agnostic to the topography of substrate 202 and/or superstrate 204 are discussed in more detail now. The superstrate-fluid-substrate sandwich displays rich dynamical behavior that can be predicted using the forward model of equation (1), given an initial condition. However, given the dissipative nature and symmetry boundary conditions used for the system, the equilibrium state $\tau \sim \infty$ is always the same for any given initial condition. This equilibrium state is realized by superstrate 204 achieving a zero-deformation state with the fluid film thickness profile given by $h(x, \infty)=h_0-w_s(x)+w_0(x)$, where $h_0$ is the mean film thickness. As can be seen, both the topography of superstrate 204 and substrate 202 determine the equilibrium film thickness profile. For deposition of films with prescribed spatial variation, it is desired for the system to be far removed from equilibrium, as equilibrium can only yield a single possible solution, which again is influenced only by the topography of substrate 202 and superstrate 204.

The need to move towards smaller process times or higher characteristic time scales has been asserted to minimize the influence of parasitic topography, while keeping the process times high enough for robust drop merging leading to optimal process time ($\tau_{optimal}$) in the interval ($\tau_{robust}$, $\tau_{linear}$). Hence, to be able to program a desired non-uniform film thickness profile, the problem becomes one of finding the desired non-equilibrium transient, such that the prescribed spatial profile is met. The use of thin superstrates 204, like the 250 μm cored superstrate 204, assists in lengthening the time scale, such that there is greater room in the physical domain to capture the desired transient. This aspect, along with the solution of the optimal locations/volume of the discrete fluid drops 201, forms the basis of the inverse model formulation which forms the basis for programming the deposition of prescribed non-uniform film thickness profiles.

Figure 11:
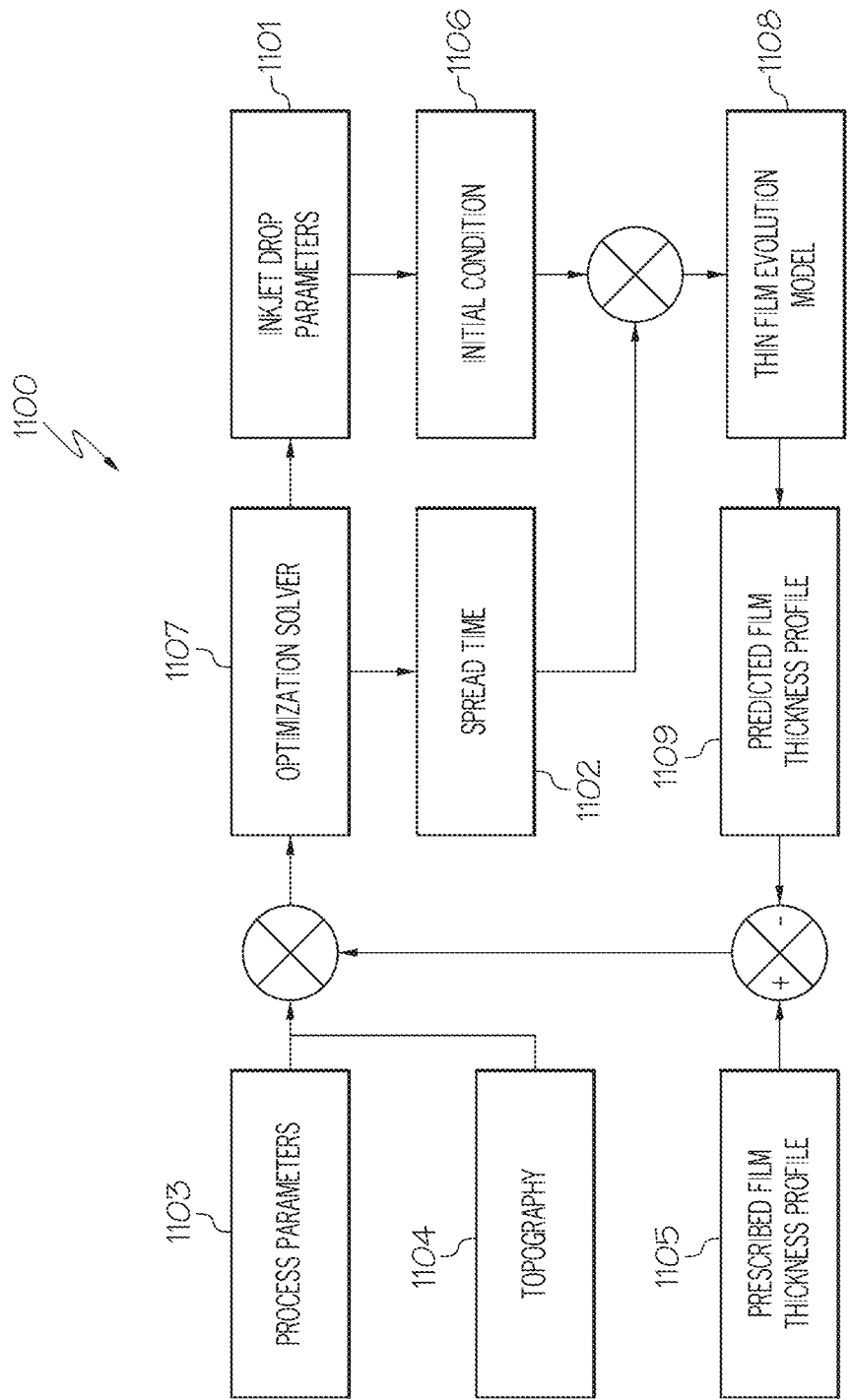
FIG. 11 illustrates the inverse optimization framework in accordance with an embodiment of the present invention.

The inverse model formulation has several important aspects that culminate into obtaining the desired non-equilibrium transient as illustrated in FIG. 11. FIG. 11 illustrates the inverse optimization framework 1100 in accordance with an embodiment of the present invention. The inkjet parameters 1101 and spread time 1102 are the outputs while the other process parameters 1103, topography 1104 and prescribed film thickness profile 1105 form the inputs. Achieving this desired non-equilibrium state first requires determining an optimum initial condition 1106 for the system and then, an optimum time to which this initial condition 1106 is evolved by optimization solver 1107. Optimization solver 1107 may include genetic algorithms, patterned search, simulated annealing and other such techniques or combinations thereof. The kernel of the formulation is given by the linearized model 1108 without topography because of its analytical simplicity, which gives the final profile 1109 given an initial condition 1106. However, initial condition 1106 of the system, itself, is a result of the spreading and merging of thousands of drops 201. Prescribing initial condition 1106 is, thus, tantamount to prescribing the volume and x and y location of each of these thousands of drops 201. Along with inkjet drop related parameters, the optimum time to which the system needs to be evolved also forms an output of the model 1108. The primary inputs include the time-scale of the process, given by equation 2 and the associated system parameters, and any topography information. The system parameters can also include any systematic parasitics such as evaporation profiles of the drops, shrinkage effects or non-uniform etch signatures, such that they can be compensated for when obtaining the desired film thickness. Hence, overall, the inverse model can be setup as an optimization routine with the objective function given as a minimization of the error between the actual film thickness profile, including its integrals and derivatives, and the desired film thickness profile, including its integrals and derivatives. This error can be defined by a suitable norm that can give the appropriate deviation of the actual film thickness and the desired film thickness. For example, when an 'averaged' difference between the actual and desired film thickness values is important, the L2 norm is appropriate as it calculates the square root of the sum of squares of the deviation at each location. On the other hand, when the maximum difference becomes important, it becomes more appropriate to use the L-infinity norm. The same principles can be applied to the gradients (for example, when it is necessary to minimize slope error) or integrals (for example, when it is necessary to minimize total volume deviations) in the actual and desired film thickness profiles.

The objective function is subject to several constraints stemming from the system hardware as well as assumptions related to modeling of the process. The primary constraints are manifested in the discrete nature of the inkjet drop parameters, i.e., drop volume and location. Given that the volume and x and y locations of each drop 201 are desired outputs from the inverse model and that there are several thousand drops 201 involved for a typical film thickness deposition, the number of these integer constraints is incredibly large. This drastically increases the complexity of the optimization and renders the problem highly nonlinear. Even though the objective function is a standard minimization of error norm, an analytical solution is not tractable because of the presence of these integer constraints.

Another unusual aspect of the process is the ease with which multi-layer films—either of the same material or of different materials—can be deposited. From the thin film model, it is evident that keeping the mean film thickness ($h_o$) small helps in keeping the time scale high which is desirable for capturing non-equilibrium transients (equation 2). Hence, it can be problematic to deposit thick uniform films or films with large thickness variations in a single step. This can be alleviated by decomposing the desired profile into a sum of smaller unit increments, which ensures that the time scale is desirably high for each unit step and thus, preserves the know-how and corresponding accuracy established for a single-step process. This is briefly given in FIG. 3, where it is shown that, for uniform films, films with thickness as high as 450 nm have been obtained with excellent uniformity by depositing 150 nm films three times in succession.

Because the preferred method for deposition is inkjetting, a multi-step process can be extended to the deposition of multi-material stacks by using different inkjettable materials, such that each layer in the stack has a prescribed profile. This enables the deposition of films with material as well as thickness gradients in its depth direction, a feature that is not easily available in the current state-of-the-art. This process could be achieved by having a set of multi jets with distinct materials in each of the multi-jets, or even different materials in a single multi-jet. The entire process could be achieved without the substrate being removed from the tool between the various individual PAINT steps.

With respect to potential applications of PAINT, polymer films of uniform nanoscale thickness are used for a host of applications, including but not limited to, anti-reflection coatings in optics and semiconductors, precursor films for producing monodisperse nanoparticles in biomedicine, etc. The deposition of spatially varying films also has some novel applications that are discussed herewith. These are by no means an exhaustive list of applications for PAINT.

Gradient Surfaces

Gradient surfaces represent a continuous change in one or more material properties over space, thus permitting the exploration of an immense set of experimental conditions. The influence of entire parameter spaces can be captured simultaneously on a single specimen, leading to faster materials experimentation with less waste. In fact, combinatorial approaches of materials characterization are often used interchangeably with "high throughput experiments," bringing out the power and utility of these techniques to the experimental material scientist. This simultaneous expression of material behavior can be amplified by combining more than one gradient on the same specimen, leading to even greater savings. The properties of interest for gradient surfaces can be chemical (e.g., composition, wettability, etc.) as well as physical (e.g., temperature, film thickness, etc.). Such surfaces can be used for characterizing and screening of material properties as well as for driving process-related phenomena. For example, with thickness gradients alone, all the above objectives can be achieved. Graded block copolymer film thicknesses can help in understanding and characterizing the morphology or dewetting of block copolymers as a function of film thickness. At the same time, the same thickness gradients can be useful in the discovery and screening of sensing materials, such as fluorescent dyes with respect to a given sample. Moreover, the spatially varying interfacial energies that are concomitant with films of prescribed nanoscale thickness variation can be used to enhance or disrupt the motion of drops of certain materials. Hence, it can be seen that even with film thickness gradients alone, there is tremendous opportunity for such surfaces, particularly in the biomedical, pharmaceutical and biomaterials domain, where there is a need for high-throughput and cost-effective creation of gradient libraries. This has been solved for by using PAINT to get linearly graded film thickness profiles of thickness ranging from 25 nm to 100 nm across a 40 mm area as illustrated in FIGS. 12A and 12B.

Figure 12A:
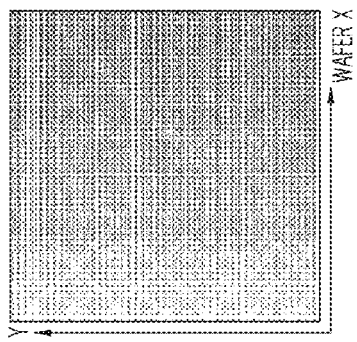
FIG. 12A is a plot of the linearly graded film thicknesses in accordance with an embodiment of the present invention.
Figure 12B:
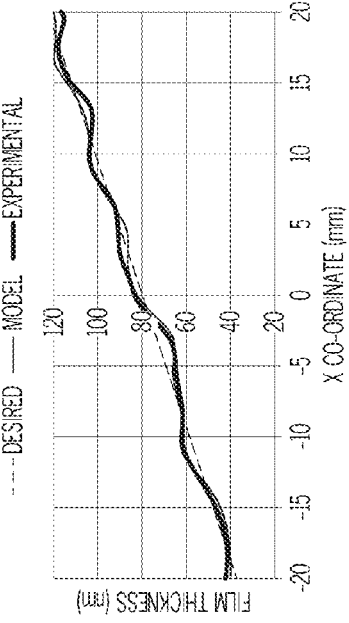
FIG. 12B is a schematic of the drop pattern in accordance with an embodiment of the present invention.

FIG. 12A is a plot of the linearly graded film thicknesses in accordance with an embodiment of the present invention. The plot reveals that the model has some errors in matching the desired profile exactly. This is attributed to constraints from the drop resolution as well as discrete drop locations. FIG. 12B is a schematic of the drop pattern in accordance with an embodiment of the present invention.

Surfaces for Low Curvature Freeform Optics

Low curvature freeform optics finds applications in several domains of low wavelength imaging. It has been discussed in the context of x-ray optics herein. Imaging of x-rays has been a very useful tool in the astronomical and medical domains. Recently, there has been a thrust towards enabling nanoscale imaging using x-rays, particularly for the purpose of nanoscopy. Reliable nanoscopy using x-rays can potentially have significant impact in the fields of biomedical imaging, semiconductor manufacturing and material identification among others. X-rays offer advantages over state-of-the-art electron-beam microscopes because of their ability to penetrate deeper into the sample and their versatility in imaging different materials. However, there are significant technical challenges towards reliably achieving the nanoscale resolution required for truly enabling nanoscopy-based applications. Most of these challenges stem from the stringent requirements for fabricating the focusing and/or imaging optics for x-ray nanoscopes. These requirements are amplified when it comes to reflective optics for hard x-rays, as compared to zone plates for soft x-rays.

Reflective optics for x-rays relies on metal-coated mirrors for focusing purposes. Silicon mirrors have also been demonstrated for integration in x-ray astronomy applications. However, reflective mirrors must use grazing incidence, i.e., near zero incidence angles, to achieve the desired resolution and focus, although this requirement is relaxed for multilayer mirrors that rely on interference related reflection. For example, critical angles of approximately 2 degrees, 0.6 degrees and 0.1 degrees are required for an iridium sample with x-rays of energy 1, 10 and 100 keV, respectively, to achieve total external reflection. Given this constraint, it can be imagined that these mirrors require stringent spatial control over the surface roughness and figure ($-\lambda/10$), which is analogous to nanotopography for wafers. The wavelength of x-rays is <10 nm, which implies that the desired spatial control is <1 nm. Any perturbation in roughness and figure above this tolerance limit can cause undesired scattering effects. Hence, adaptive figure correction is an important element for getting the desired quality of the optical elements. Moreover, the desired profile of a mirror surface is usually a conic section (parabolic, hyperbolic or elliptical), such that an arrangement of multiple such mirrors can achieve the desired focusing properties. Such profiles have been demonstrated by vacuum based preferential coating or differential deposition techniques on surfaces that are not nominally conic sections. PAINT, potentially, has the ability to do both, correct for figure imperfections as well as adaptively modify the figure to resemble conic section surfaces by depositing films with appropriate spatial variations in thickness. This has been tested by depositing a convex elliptical film with radius of curvature approaching nearly 10 km as illustrated in FIGS. 13A-13B.

Figure 13A:
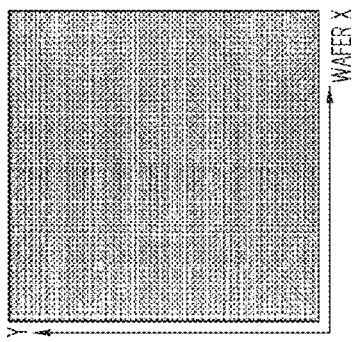
FIG. 13A is a plot of a 10 km radius of a curvature elliptical profile in accordance with an embodiment of the present invention.
Figure 13B:
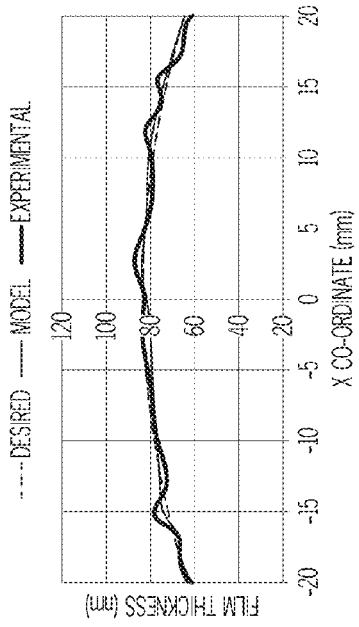
FIG. 13B is a schematic of the drop pattern in accordance with an embodiment of the present invention.

FIG. 13A is a plot of a 10 km radius of a curvature elliptical profile in accordance with an embodiment of the present invention. As illustrated in FIG. 13A, the experimental data agrees well with model predictions. FIG. 13B is a schematic of the drop pattern in accordance with an embodiment of the present invention.

A deposition of such a film may be followed by a "matched etch-back," where the resist and the substrate surface etch are etched at the same rate. This may be continued till the resist is completely removed such that the profile of the surface becomes that of an x-ray mirror. To enable functionality, a single or multiple metal layers can then be deposited using PVD or ALD.

Polishing of Substrate Topography

Given that the topography and roughness of any surface can present problems for further processing of the substrate, several techniques have evolved over many years to mitigate these. There are three basic techniques briefly described here.

Grinding, lapping and polishing are routinely used in manufacturing facilities to remove roughness on a variety of substrates, including metals, glasses, semiconductors, optics and ceramics. Depending upon the quality and roughness of the final surface finish, the mechanical properties of the substrate and the irregularities or longer-range topography, one or more of these processes can be used to achieve the desired objective. They rely on mounting the substrates on rotating wheels or jigs and using abrasive particles of varying sizes to correct for the roughness and topography. While grinding is used for coarse-level correction with high speeds and large particles, lapping and polishing and their variants can produce much finer surface finishes of precision optics quality.

At this point, it is instructive to look at a high-end application requiring excellent surface quality, namely the fabrication of mask blanks for Extreme Ultra-Violet Lithography (EUVL), which is carried out with 13.5 nm wavelength light. Techniques, such as Magneto-Rheological Finishing (MRF) and Ion Beam Figuring (IBF), have been suggested to correct for the flatness in EUVL mask blanks. However, both these techniques suffer from very slow turn-around times either due to the inherently low throughputs or due to additional polishing steps required to continuously correct for the flatness. Such techniques are therefore costly and are limited only to parts that can command very high value.

To meet the stringent requirement of planarity in submicron device technologies Chemical Mechanical Polishing (CMP) is the most widely used polishing technology. It uses a combination of abrasive laden chemical slurry and a mechanical pad for achieving planar profiles. The biggest concern with CMP is the dependence of material removal rate on the pattern density of material, leading to the formation of a step between the high density and low-density. The step shows up as a long-range thickness variation in the planarized film, similar in scale to the nanotopography of the surface. Preventive techniques like dummy fill and patterned resist can be used to reduce the variation in pattern density. These techniques increase the complexity of the planarization process and significantly limit the device design flexibility. CMP has been demonstrated on non-flat surfaces as well. However, the material and hardware required for planarizing such substrates are different from those required for planar surfaces, hence limiting flexibility across different profiles.

Contact Planarization (CP) has been reported as an alternative to the CMP processing. A substrate is spin coated with a photo curable material and pre-baked to remove residual solvent. An ultra-flat surface or an optical flat is pressed on the spin-coated wafer. The material is forced to reflow. Pressure is used to spread out material evenly and achieve global planarization. The substrate is then exposed to UV radiation to harden the photo curable material. Although attractive, this process is not adaptive as it does not account for differences in surface topography of the wafer and the optical flat, nor can it address all the parasitics that arise during the process itself. Also, using a high-viscosity material slows down the reflow and limits the throughput that can be achieved.

Figure 14:
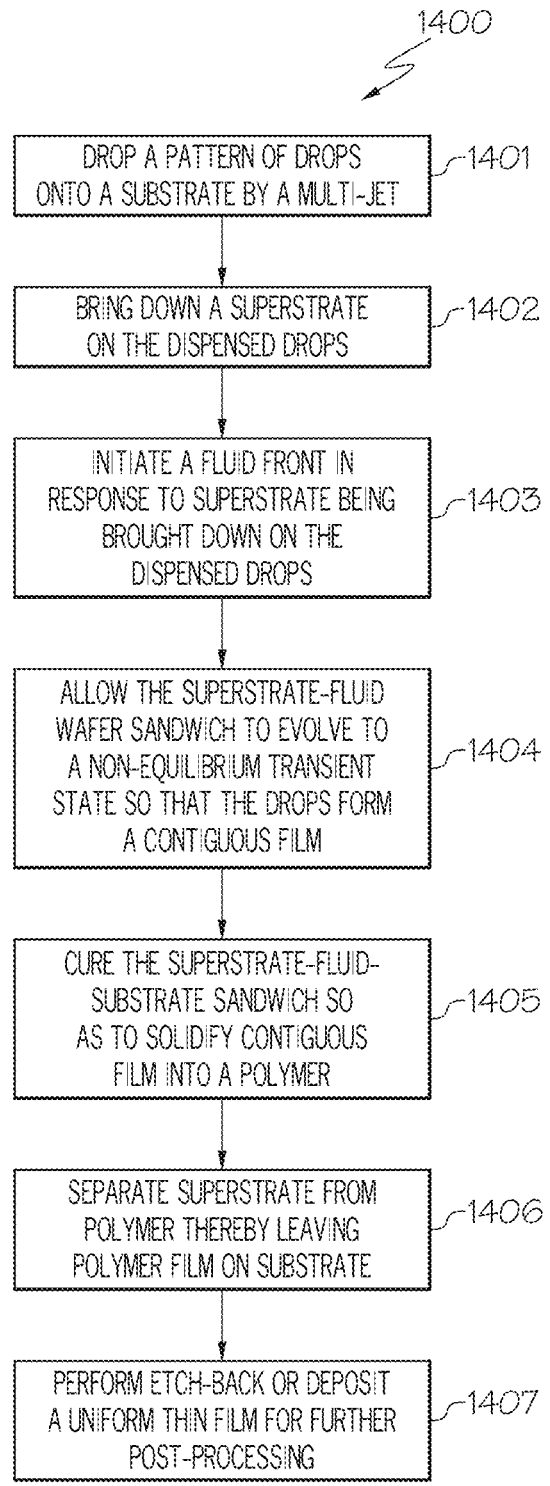
FIG. 14 is a flowchart of a method for polishing of wafer topography using PAINT in accordance with an embodiment of the present invention.

PAINT is a potentially ideal alternative for substrate polishing, as it can deposit films of varying thickness to compensate for the topography of any substrate and get a nominally flat top surface. A process for using PAINT as an alternative for substrate polishing is discussed below in connection with FIGS. 14 and 15A-15F. FIG. 14 is a flowchart of a method 1400 for polishing of substrate topography using PAINT in accordance with an embodiment of the present invention. FIG. 14 will be discussed in conjunction with FIGS. 15A-15F, which depict the cross-sectional views for polishing of substrate topography using the steps described in FIG. 14 in accordance with an embodiment of the present invention.

Referring to FIG. 14, in step 1401, a pattern of drops of a pre-cursor liquid organic material 1502 are dropped onto various locations on a wafer 1501 based on the topography of wafer 1501 by one or more multi jets 1503 as illustrated in FIGS. 15A-15B, where FIG. 15A illustrates substrate 1501 prior to the pattern drop and FIG. 15B illustrates dropping a pattern based on topography.

In step 1402, a superstrate 1504 (similar to superstrate 204 of FIGS. 2A-2F) is brought down on the dispensed drops 1502 as illustrated in FIG. 15C.

As discussed above, in one embodiment, superstrate 1504 is used to form a contiguous film 1506 captured between wafer 1501 and superstrate 1504 in step 1403 as illustrated in FIGS. 15D and 15E. The shape of superstrate 1504 and the speed at which it comes down may be chosen to allow drops 1502 to merge laterally to minimize any trapping of air bubbles to form a contiguous film 1506 as discussed above.

In step 1404, the superstrate-fluid-wafer sandwich is allowed to evolve to a non-equilibrium transient state after a duration of time so that drops 1502 form a contiguous film 1506 with a superstrate layer 1504 on top of the contiguous film 1506 as illustrated in FIG. 15E.

In step 1405, the superstrate-fluid-wafer sandwich is cured from UV exposure 1507 so as to crosslink contiguous film 1506 into a polymer film as illustrated in FIG. 15E.

In step 1406, superstrate 1504 is separated from the polymer thereby leaving a polymer film 1508 on wafer 1501 as illustrated in FIG. 15F.

In step 1407, the deposited film 1508 and substrate 1501 may be etched simultaneously at the same rate to transfer the flat top profile to substrate 1501, or as shown, additional uniform films may be deposited on the now flat top surface to enable further post-processing.

In some implementations, method 1400 may include other and/or additional steps that, for clarity, are not depicted. Furthermore, in some implementations, method 1400 may be executed in a different order than presented. Additionally, in some implementations, certain steps in method 1400 may be executed in a substantially simultaneous manner or may be omitted.

As discussed above in connection with FIGS. 14 and 15A-15F, the idea here is to get a drop pattern such that the film thickness profile is a negative of the substrate topography. With high quality nanotopography metrology, and picoliter volume resolution, precise negative of the substrate topography can be deposited to achieve a substantially flat top surface.

Figure 16:
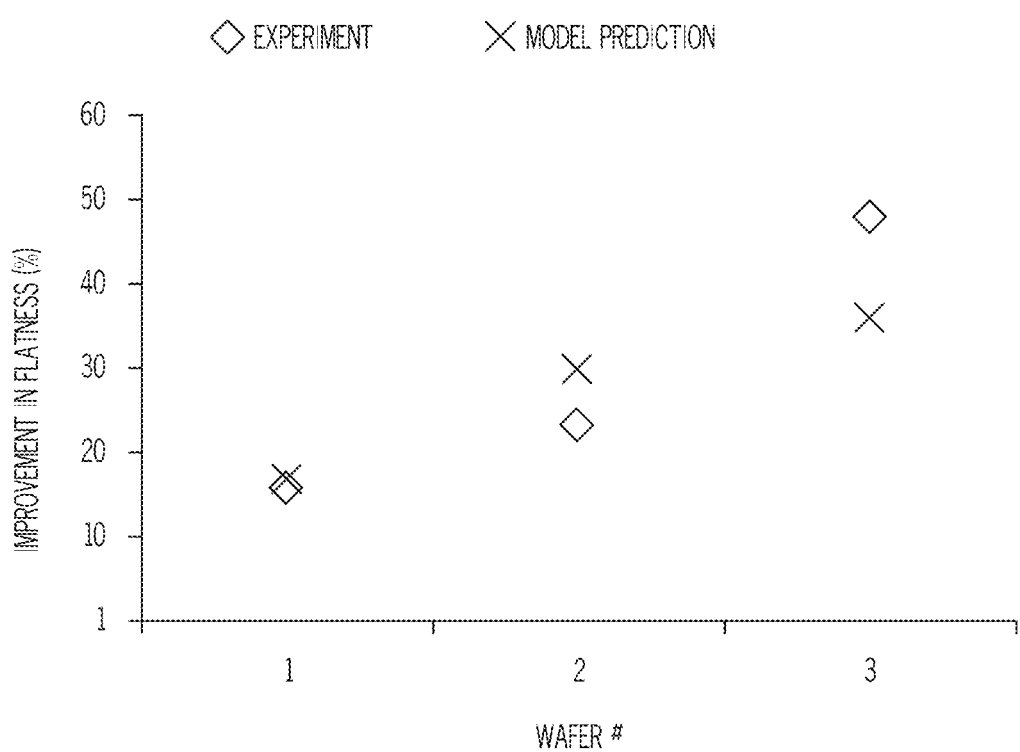
FIG. 16 is a plot showing single-step migration of topography on 3 silicon wafers using PAINT in accordance with an embodiment of the present invention.

To demonstrate this polishing capability of PAINT, the process was explored using three 3 inch single-side polished Si wafers. With this, almost 50% reduction in substrate topography in a single step has been achieved as illustrated in FIG. 16. FIG. 16 is a plot showing single-step migration of topography on 3 silicon wafers using PAINT in accordance with an embodiment of the present invention. Potentially, much higher reductions can be possible with further iterations of the PAINT process, improved drop volume resolution and improved metrology of the starting nanotopography.

In the experimental demonstration above, a highly uniform thin film of metal was deposited to make the wafer surface reflective for optical profilometry. In general, this may not be feasible for applications, such as semiconductors, where a metal surface is not desirable. Another potential alternative is to perform a "matched etch-back," where the etching of the resist and the substrate proceeds at the same rate. This ensures that the final surface obtained is of the same material as the wafer. This method, too, has its drawbacks, as etching can degrade the quality of the semiconductor surface, particularly for critical front-end applications. If so, PAINT can be used to correct for backside topography of the semiconductor wafer, which serves the same purpose of maintaining flatness across the entire wafer. A matched etch-back may not be necessary as it may not be important to reveal the semiconductor surface on the backside. During backside polishing with PAINT, the frontside of the wafer can be protected by a polymer film that can easily be washed away in a solvent.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A process for depositing thin films, the process comprising:

dispensing drops of a pre-cursor liquid organic material at a plurality of locations on a substrate by an array of inkjet nozzles;

bringing down a superstrate thereby allowing said drops to form a contiguous film captured between said substrate and said superstrate;

selecting parameters of said superstrate to enable increased time to an equilibrium state thereby enabling capture of non-equilibrium transient states of said superstrate, said contiguous film and said substrate;

curing said contiguous film to solidify it into a solid; and separating said superstrate from said solid thereby leaving a polymer film on said substrate.

2. The process as recited in claim 1 further comprising:

bringing down said superstrate that has been bowed due to a backside pressure such that a first contact on said drops is made by a front side of said superstrate thereby initiating a liquid front that spreads outward merging with said drops to form said contiguous film.

3. The process as recited in claim 2 further comprising:

bringing down said superstrate such that said first contact on said drops is made by said front side of said superstrate in a local atmosphere of gases that are soluble in organic liquids.

4. The process as recited in claim 2 further comprising:

bringing down said superstrate such that said first contact on said drops is made by said front side of said superstrate in a local atmosphere of helium or carbon dioxide.

5. The process as recited in claim 1, wherein said superstrate is porous and allows trapped gases to be transmitted.

6. The process as recited in claim 1, wherein said superstrate comprises a material of glass, ceramics, polymers or combinations thereof.

7. The process as recited in claim 1, wherein a surface of said superstrate is coated with a low surface energy coating, wherein a surface of said substrate is coated with an adhesion promoter.

8. The process as recited in claim 1, wherein said contiguous film is cured by photonic or thermal energy to solidify said contiguous film into said polymer.

9. The process as recited in claim 1, wherein said contiguous film is cured by exposure to ultraviolet radiation through said substrate or said superstrate.

10. The process as recited in claim 1, wherein said superstrate is a roll of plastic held under tension.

11. The process as recited in claim 10, wherein said substrate is composed of a material with a Young's modulus greater than 1 GPa.

12. The process as recited in claim 10, wherein said substrate is a rigid wafer composed of one or more of the following materials: silicon, silicon dioxide and gallium nitride.

13. The process as recited in claim 10, wherein a first portion of said roll of plastic is used as a first superstrate, wherein a second portion of said roll of plastic is used as a second superstrate.

14. The process as recited in claim 10, wherein said substrate is a roll of plastic.

15. The process as recited in claim 14, wherein said substrate is held against a vacuum or a porous chuck.

16. The process as recited in claim 14, wherein said substrate is more rigid than said superstrate.

17. The process as recited in claim 14, wherein a ratio of an effective bending rigidity of substrate to said superstrate exceeds 5.

18. The process as recited in claim 1, wherein said superstrate comprises fused silica wafers, wherein an outer ring of said wafers has a higher thickness in comparison to an inner ring of said wafers which interacts with said drops of said pre-cursor liquid organic material.

19. The process as recited in claim 1 further comprising:
depositing multi-material stacks on said substrate by using different inkjettable materials.

20. The process as recited in claim 19, wherein a set of inkjet nozzles deposits said multi-material stacks on said substrate, wherein one or more inkjet nozzles in said set of inkjet nozzles have a different material.

21. The process as recited in claim 1, wherein said superstrate has an effective bending rigidity with an optimal range defined by being higher than a minimum required to create merging of said drops while lower than a maximum required to ensure that said contiguous film does not equilibrate prior to a designed duration of time following said bringing down of said superstrate.

22. The process as recited in claim 21, wherein a pre-equilibrium transient of said contiguous film creates a film thickness profile whose volume distribution is a function of a volume distribution of said drops dispensed on said substrate.

23. The process as recited in claim 1, wherein a location and a volume of said dispensed drops on said substrate are obtained by solving an inverse optimization to minimize a norm of error between an actual film thickness profile and a desired film thickness profile.

24. The process as recited in claim 23, wherein said inverse optimization includes discrete variables associated with drop volumes and/or drop locations.

25. The process as recited in claim 1 further comprising:
etching said polymer film to allow a transfer of a film thickness profile to an underlying functional film or said substrate.

26. The process as recited in claim 1, wherein a minimum volume of drops dispensed is below 5 picoliters using either piezo jets or electro hydro dynamic jets.

27. The process as recited in claim 1, wherein a minimum volume of drops dispensed is below 1 picoliter using either piezo jets or electro hydro dynamic jets.

28. A process for depositing intentionally non-uniform films, the process comprising:
obtaining a desired non-uniform film thickness profile;
solving an inverse optimization program to obtain a volume and a location of dispensed drops so as to minimize a norm of error between said desired non-uniform film thickness profile and a final film thickness profile such that a volume distribution of said final film thickness profile is a function of said volume and said location of said dispensed drops;
dispensing said drops of a pre-cursor liquid organic material at a plurality of locations on a substrate by an array of inkjet nozzles;
bringing down a superstrate to form a contiguous film captured between said substrate and said superstrate;
obtaining a time to a non-equilibrium transient state of said superstrate, said contiguous film and said substrate by using said inverse optimization scheme;
curing said contiguous film to solidify it into a polymer; and
separating said superstrate from said polymer thereby leaving a polymer film on said substrate.

29. The process as recited in claim 28, wherein said process is used for polishing a topography of said substrate.

30. The process as recited in claim 29, wherein said desired non-uniform film thickness profile is designed to compensate said topography of said substrate.

31. The process as recited in claim 28, wherein said desired non-uniform film thickness profile is given by a desired surface profile on said substrate and a starting substrate measured topography.

32. The process as recited in claim 31, wherein said process is used for compensating process parasitics comprising one or more of the following: evaporation, shrinkage and etch back.

33. The process as recited in claim 28, wherein said desired non-uniform film thickness profile compensates for imperfections in a shape of said substrate.

34. The process as recited in claim 33, wherein said shape of said substrate is a planar shape.

35. The process as recited in claim 33, wherein said shape of said substrate is a non-planar shape.

36. The process as recited in claim 33, wherein said process is used for compensating process parasitics comprising one or more of the following: evaporation, shrinkage and etch back.

* * * * *